United States Patent
Colli

(10) Patent No.: US 8,461,571 B2
(45) Date of Patent: Jun. 11, 2013

(54) METHOD AND APPARATUS FOR CONVERTING PHOTON ENERGY TO ELECTRICAL ENERGY

(75) Inventor: Alan Colli, Cambridge (GB)

(73) Assignee: Nokia Corporation, Espoo (FI)

( * ) Notice: Subject to any disclaimer, the term of this patent is extended or adjusted under 35 U.S.C. 154(b) by 96 days.

(21) Appl. No.: 13/172,097

(22) Filed: Jun. 29, 2011

(65) Prior Publication Data
US 2013/0001514 A1 Jan. 3, 2013

(51) Int. Cl.
*H01L 29/06* (2006.01)

(52) U.S. Cl.
USPC ........ 257/21; 257/E31.033; 438/98; 977/750; 977/752

(58) Field of Classification Search
USPC ................ 257/21, E31.033; 98/98; 977/750, 977/752
See application file for complete search history.

(56) References Cited

U.S. PATENT DOCUMENTS

| 2008/0089829 | A1 | 4/2008 | Ganapathiraman et al. | |
|---|---|---|---|---|
| 2010/0163285 | A1* | 7/2010 | Marinero | 174/257 |
| 2010/0295019 | A1 | 11/2010 | Wang et al. | |
| 2011/0129675 | A1 | 6/2011 | Choi et al. | |

FOREIGN PATENT DOCUMENTS
KR 20110020443 A 3/2011

OTHER PUBLICATIONS

Nair, R.R., et al., "Fine Structure Constant Defines Visual Transparency of Graphene", Jun. 6, 2008, www.sciencemag.org, Science, vol. 320, 1 pg.
Dawlaty, J.M., et al., "Measurement of the Optical Absorption Spectra of Epitaxial Graphene from Terahertz to Visible", © 2008 American Institute of Physics, 3 pgs.
Kang, Y., et al., "Monolithic Germanium/Silicon Avalanche Photodiodes with 340 GHz Gain-Bandwidth Product", © 2009 Macmillan Publishers Limited, Nature Photonics, vol. 3, Jan. 2009, 5 pgs.
Mueller, T., et al., "Role of Contacts in Graphene Transistors: A Scanning Photocurrent Study", © 2009 The American Physical Society, 6 pgs.
Mueller, T., et al., "Graphene Photodetectors for High-Speed Optical Communications", © 2010 Macmillan Publishers Limited, Nature Photonics, Advance Online Publication, 5 pgs.
Stubenrauch, M., et al., "Black Silicon—New Funtionalities in Microsystems", © 2006 IOP Publishing Ltd, 7 pgs.
Vasko, F.T., et al., "Photoconductivity of Intrinsic Graphene", © 2008 The American Physical Society, 8 pgs.
Wright, A.R., et al., "Enhanced Optical Conductivity of Bilayer Graphene Nanoribbons in the Terahertz Regime", © 2009 The American Physical Society, 4 pgs.
Xia, F., et al., "Photocurrent Imaging and Efficient Photon Detection in a Graphene Transistor", ACS, Nov. 7, 2008, 7 pgs.
Fan, G., et al., "Graphene/Silicon Nanowire Schottky Junction for Enhanced Light Harvesting", ACS, Oct. 25, 2010, 5 pgs.
Xia, F., et al., "Ultrafast Graphene Photodetector", Nature Nanotechnology, vol. 4, Dec. 2009, 5 pgs.

(Continued)

*Primary Examiner* — Tan N Tran
(74) *Attorney, Agent, or Firm* — Harrington & Smith

(57) ABSTRACT

In accordance with an example embodiment of the present invention, an apparatus including a nanopillar and a graphene film, the graphene film being in contact with a first end of the nanopillar, wherein the nanopillar includes a metal, the contact being configured to form an intrinsic field region in the graphene film, and wherein the apparatus is configured to generate a photocurrent from a photogenerated charge carrier in the intrinsic field region.

16 Claims, 4 Drawing Sheets

OTHER PUBLICATIONS

Lee, J.M., et al., "Vertical Pillar-Superlattice Array and Graphene Hybrid Light Emitting Diodes", © 2010 American Chemical Society, 6 pgs.

Park, J., et al., "Imaging of Photocurrent Generation and Collection in Single-Layer Graphene", © 2009 American Chemical Society, 5 pgs.

Lai, King Wai Chiu; Fung, et al., "Fabrication of graphene devices for infrared detection, Nanotechnology Materials and Devices Conference" (NMDC), 2010 IEEE ; Publication Year: 2010 , pp. 14-17.

DuFaux, Thomas, et al.; "Photocurrent Distribution in Graphene—CdS Nanowire Devices," Small, Sep. 2010, vol. 6, No. 17, (Nov. 25, 2010), pp. 1868-1872.

Z Fan et al.; "Challenges and Prospects of Nanopillar-Based Solar Cells," Nano Research (Nov. 2009; Issue 11; vol. 2) pp. 829 843.

Feng, Tingting; "Graphene based Schottky junction solar cells on patterned silicon-pillar-array substrate," Applied Physics Letters; Dec. 2011; vol. 99, Issue: 23; p. 233505-1-233505-3.

Fu, X-W., et al.; "Graphene/ZnO nanowire/graphene vertical structure based fast-response ultraviolet photodetector," Appl. Phys. Lett. vol. 100, No. 22, p. 223114-1-22114-4 (2012).

Chao, X, et al.; "Monolayer graphene film/silicon nanowire array Schottky junction solar cells," Applied Physics Letters; Sep. 2011; vol. 99, Issue: 13, pp. 133113-133113-3.

* cited by examiner

METHOD AND APPARATUS FOR CONVERTING PHOTON ENERGY TO ELECTRICAL ENERGY

TECHNICAL FIELD

The present application relates generally to a method and apparatus for converting photon energy to electrical energy.

BACKGROUND

Photodetectors measure photon flux or optical power by converting absorbed photon energy into electrical energy, typically in the form of an electric current. They are widely used in a range of common devices, such as remote controls, televisions, DVD players and cameras.

SUMMARY

Various aspects of examples of the invention are set out in the claims.

According to a first aspect of the present invention, there is provided an apparatus comprising a nanopillar and a graphene film, the graphene film being in contact with a first end of the nanopillar, wherein the nanopillar comprises a metal, the contact being configured to form an intrinsic field region in the graphene film, and wherein the apparatus is configured to generate a photocurrent from a photogenerated charge carrier in the intrinsic field region.

According to a second aspect of the present invention, there is provided a method of making an apparatus comprising: providing a nanopillar; providing a graphene film in contact with a first end of the nanopillar, wherein the contact is configured to form an intrinsic field region in the graphene film; and configuring the apparatus to generate a photocurrent from a photogenerated charge carrier in the intrinsic field region.

According to a third aspect of the present invention, there is provided a method of converting light energy to electrical energy, the method comprising: using an apparatus, the apparatus comprising a nanopillar and a graphene film, the graphene film being in contact with a first end of the nanopillar, wherein the nanopillar comprises a metal, the contact being configured to form an intrinsic field region in the graphene film, and wherein the apparatus is configured to generate a photocurrent from a photogenerated charge carrier in the intrinsic field region; and illuminating the intrinsic field region with light photons to generate a photocurrent.

According to a fourth aspect, there is provided a computer program, recorded on a carrier, the computer program comprising computer code configured to perform, control or enable any method described herein

BRIEF DESCRIPTION OF THE DRAWINGS

For a more complete understanding of example embodiments of the present invention, reference is now made to the following descriptions taken in connection with the accompanying drawings in which.

DETAILED DESCRIPTION OF THE DRAWINGS

Most existing photodetectors exploit the internal photoeffect, in which the absorption of photons results in a charge carrier being excited from the valence to the conduction band, resulting in an electric current. The spectral bandwidth is typically limited by the material's absorption. For example, photodetectors based on group-IV and III-V semiconductors do not absorb at longer wavelengths, as these materials transmit radiation having energy smaller than the semiconductor bandgap. Graphene absorbs from the ultraviolet to terahertz range. As a result, graphene-based photodetectors could work over a much broader wavelength range. The response time is determined by the carrier mobility, and graphene has a high mobility, so a graphene photodetector can be ultrafast.

The photoelectrical response of graphene has been investigated both experimentally and theoretically. Responses at wavelengths of 0.514, 0.633, 1.5 and 2.4 µm have been reported. Much broader spectral detection is expected because of the graphene ultra-wide-band absorption. A photoresponse of up to 40 GHz has been reported. The maximum possible operating bandwidth of photodetectors is typically restricted by their transit time, and the finite duration of the photogenerated current. The transit time limited bandwidth of a graphene photodetector may exceed 1,500 GHz, surpassing that of known photodetectors. An example embodiment of the present invention and its potential advantages are understood by referring to FIGS. 1 through 3 of the drawings.

Figure 1:
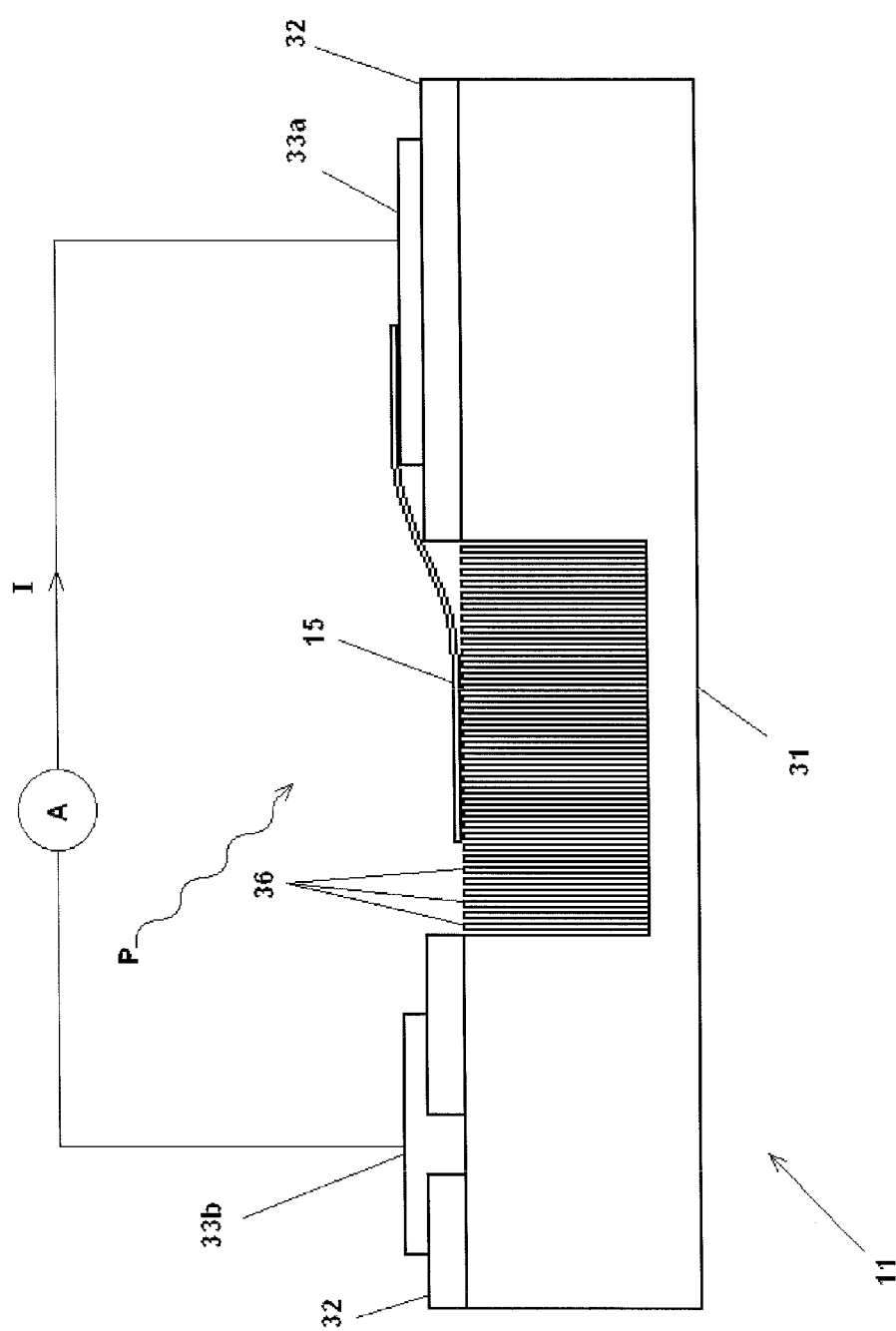
FIG. 1 schematically illustrates an apparatus according to one aspect of the invention.

FIG. 1 depicts a schematic diagram of an apparatus 11 comprising an array of nanopillars 36, a graphene film 15, a first gold electrode 33a, a second gold electrode 33b, a substrate 31, a current detector A, and an insulating oxide layer 32.

Figure 2:
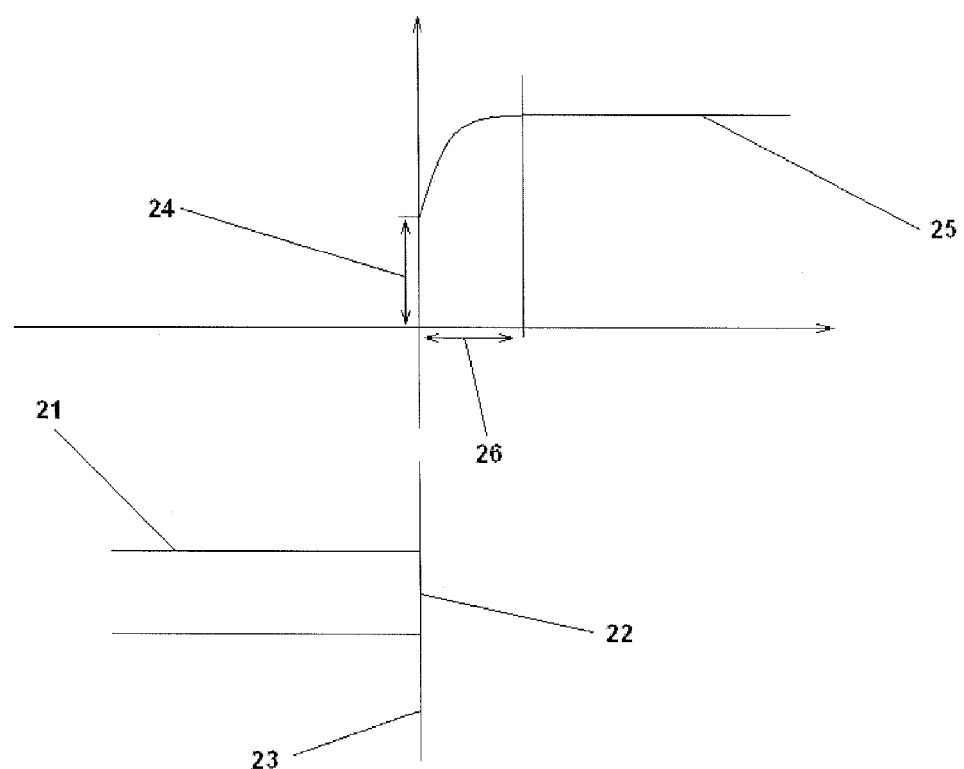
FIG. 2 schematically illustrates a component of an apparatus according to one aspect of the invention.

FIG. 2 depicts a schematic diagram of a first end 21 of one of the nanopillars 36, shown in FIG. 1, the graphene film 15 being in contact 22 with the first end 21.

Each nanopillar in the array 16 comprises a metal, and the contact 22 is configured to form an intrinsic field region 26 in the graphene film 15. At the contact 22, the graphene band edge 25 has substantially the same energy as the Schottky barrier 24; the Schottky barrier 24 resulting from a difference in work function between graphene and the metal. In the intrinsic field region 26, an intrinsic electric field is formed as a result of charge redistribution. The intrinsic field region 26 extends across an interface between the graphene layer 15, and the array of nanopillars. The intrinsic field region 26 extends a distance between 100 and 200 nm from the contact 22 into the graphene layer 15.

The apparatus 11 is configured to generate a photocurrent from a photogenerated charge carrier in the intrinsic field region. An electron-hole pair, photogenerated by a photon, P, absorbed, for example in the graphene film 15, may separate in the intrinsic field region 26 to form a free electron and free hole. Movement of the free electron and free hole, under the influence of the intrinsic electric field, results in a photocurrent, I, across the intrinsic field region 26, and between the first and second gold electrodes 33a, 33b. The photocurrent, I is detected by the current detector A. The apparatus 11 may therefore be used as a photodetector, to detect the photon P, by measurement of the photocurrent, I.

There are two main phenomena that make the apparatus 11 a highly efficient photodetector. The graphene layer 15 may itself absorbs little of radiation impinging upon the apparatus 11, however, the array of nano-pillars 36 may provide an efficient structure for light trapping. Because of local field-enhancement and related plasmonic effects, absorption of photons in the graphene layer may be enhanced as a result of contact between the nanopillar array 36 and the graphene layer 15. Although the first electrode 33a comprises gold in this example, other metals that do not oxidize significantly in air may be employed to form a contact with the graphene, and these may include one or more of: platinum, paladium, and nickel. Movement of a free electron and free hole, under the influence of the intrinsic electric field, results in a photocurrent across the intrinsic field region 26, which extends a distance between 100 and 200 nm from the contact 22 into the graphene layer 15. By employing a configuration that results in a multiplicity of contacts 22, the photocurrent may correspondingly be increased.

Figure 3A:
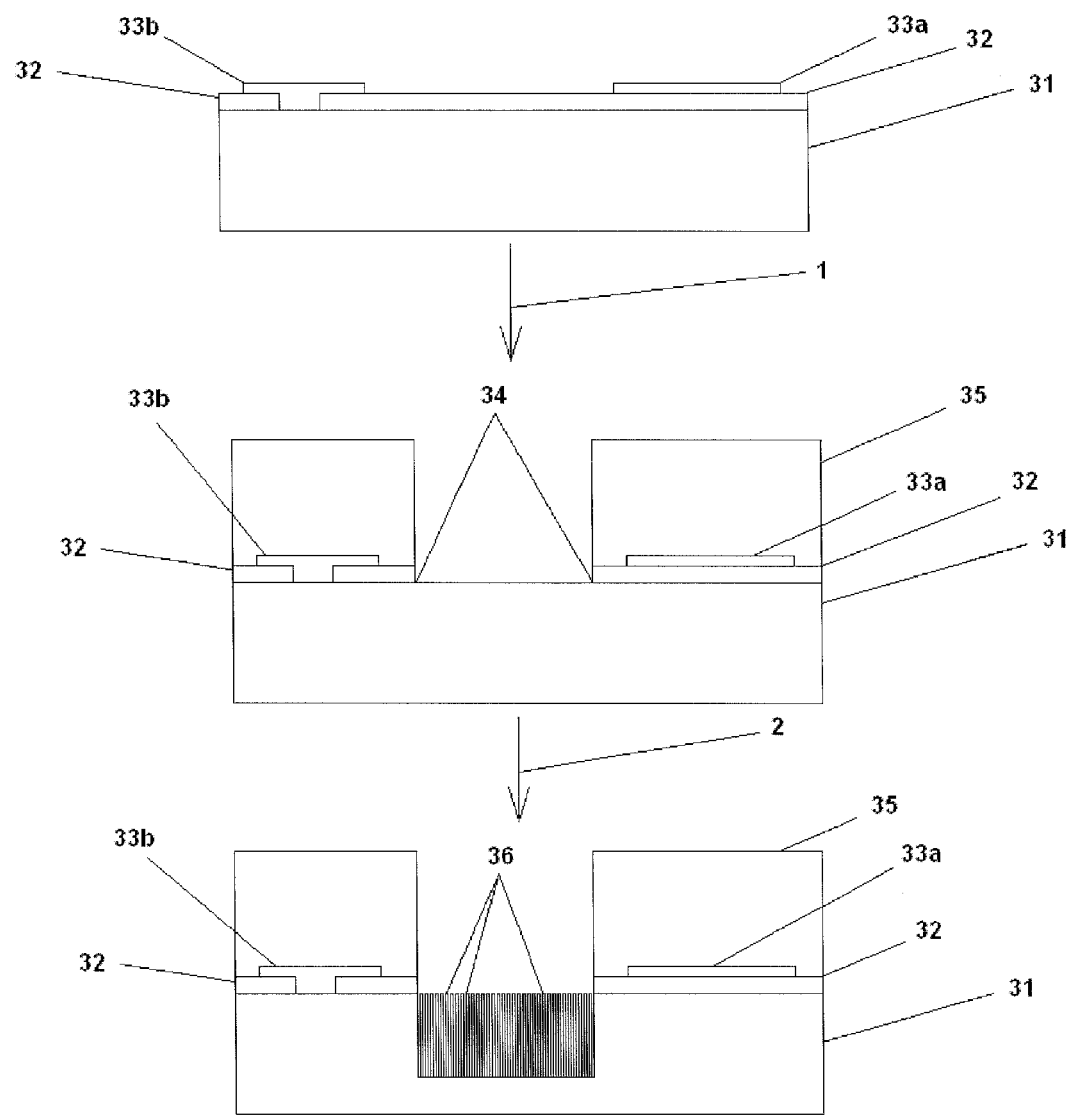
FIG. 3a is a flow diagram showing steps for fabricating an apparatus according to one aspect of the invention.
Figure 3B:
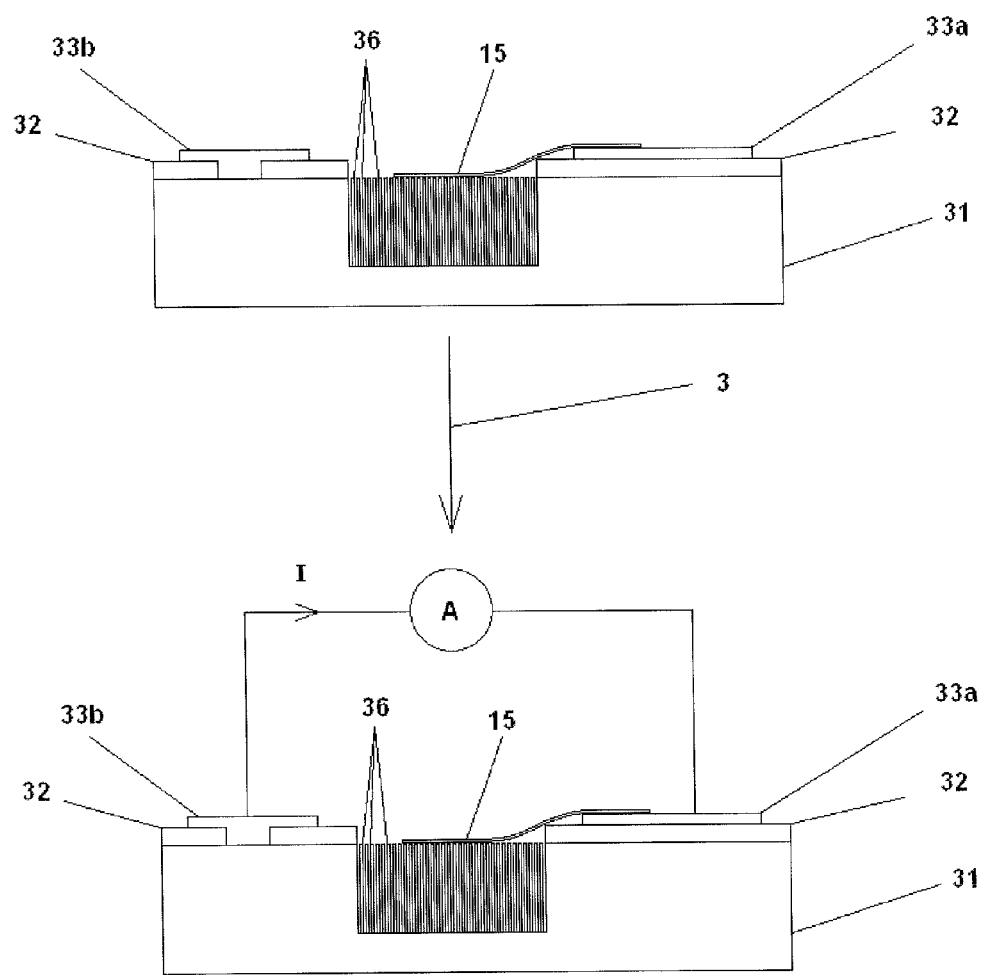
FIG. 3b is a flow diagram showing steps for fabricating an apparatus according to one aspect of the invention.

The apparatus 11 is fabricated by a process schematically illustrated in FIGS. 3a and 3b. A surface of a substrate 31, which in this case is a heavily doped silicon wafer, is thermally oxidized, to yield a 100-nm-thick silicon oxide insulating layer 32. First gold electrode 33a, in contact with the insulating layer 32, and second gold electrode 33b, in contact with the silicon wafer 31, are deposited. A sacrificial photoresist layer 35 is deposited, by photolithography, and an opening 34 is produced in the silicon oxide layer 32, at step 1, shown in FIG. 3a, by local etching, by a wet process using a buffered HF etchant to expose the underlying silicon wafer 31.

Silicon nanopillars 36 are fabricated, at step 2, shown in FIG. 3a, by a silicon etching process in an inductively coupled plasma chamber. The chamber comprises an inductively coupled coil that generates a plasma from a gas introduced to the chamber. The process, which has a duration between 15 and 40 minutes, comprises alternate passivation of the silicon wafer surface, and etching. Etching has two phases: etching of a passivation layer formed by the passivation, and then etching of silicon surface exposed by etching of the passivation layer. During the entire silicon etching process, the chamber temperature is 40 C, and silicon wafer temperature is 20-30 C. During passivation: $C_4F_8$ gas flow into the chamber is 85 sccm, the cycle time is 10-16 s, coil power is 500-600 W, and the chamber pressure is 18 mTorr. During the etching cycle $SF_6$ gas flow is 130 sccm, $O_2$ gas flow is 13 sccm, the cycle time is 9 s, the coil power is 500-600 W, substrate power is 10-20 W, and the chamber pressure is 38 mTorr. Silicon nanopillars 36 having a diameter in the 50-100 nm range, and an average separation between 100 and 800 nm can be obtained by this process.

Nickel is then sputtered onto the array of nanopillars 36 to form metallized Si nanopillars, the sacrificial photoresist 35 is removed, and a graphene flake 37 is deposited, at step 3, on the array of nanopillars 36 to make electrical contact between the nanopillars 36 and the first gold electrode 33a. At step 3, shown in FIG. 3b, the apparatus is configured to generate a photocurrent from a photogenerated charge carrier in the intrinsic field region by electrically connecting electrodes 33a and 33b to a current detector A. In an alternative example, the array of nanopillars 36 may also comprise metallic carbon nanotubes such as multi-wall carbon nanotubes.

Without in any way limiting the scope, interpretation, or application of the claims appearing below, a technical effect of one or more of the example embodiments disclosed herein is to cause a rapid detection of radiation incident upon a photodetector. Another technical effect of one or more of the example embodiments disclosed herein is to fabricate a photodetector that is capable of detecting radiation over a wide wavelength spectrum.

If desired, the different functions discussed herein may be performed in a different order and/or concurrently with each other. Furthermore, if desired, one or more of the above-described functions may be optional or may be combined.

Although various aspects of the invention are set out in the independent claims, other aspects of the invention comprise other combinations of features from the described embodiments and/or the dependent claims with the features of the independent claims, and not solely the combinations explicitly set out in the claims.

It is also noted herein that while the above described example embodiments of the invention, these descriptions should not be viewed in a limiting sense. Rather, there are several variations and modifications which may be made without departing from the scope of the present invention as defined in the appended claims.

What is claimed is:

1. An apparatus comprising a nanopillar and a graphene film, the graphene film being in contact with a first end of the nanopillar, wherein the nanopillar comprises a metal, the contact being configured to form an intrinsic field region in the graphene film, and wherein the apparatus is configured to generate a photocurrent from a photogenerated charge carrier in the intrinsic field region.

2. The apparatus of claim 1, wherein the metal comprises at least one of the following: gold, platinum, palladium, and nickel.

3. The apparatus of claim 1, wherein the nanopillar is one of the following: a nanowire, a single-walled nanotube, or a multi-walled nanotube.

4. The apparatus of claim 1, wherein the graphene film comprises at least one layer of graphene.

5. The apparatus of claim 1, wherein the apparatus comprises an array of substantially parallel nanopillars, and wherein the graphene film is in physical contact with multiple nanopillars at the same time to form a plurality of intrinsic field regions in the graphene film.

6. The apparatus of claim 5, wherein the nanopillars have an average diameter of between 20 nm and 500 nm.

7. The apparatus of claim 5, wherein the nanopillars have an average separation of between 100 nm and 400 nm.

8. The apparatus of claim 1, wherein the apparatus comprises first and second electrical contacts, and wherein the graphene film is in contact with the first electrical contact.

9. A photodetector comprising the apparatus of claim 1.

10. A method comprising:
providing a nanopillar;
providing a graphene film in contact with a first end of the nanopillar, wherein the contact is configured to form an intrinsic field region in the graphene film; and
configuring an apparatus to generate a photocurrent from a photogenerated charge carrier in the intrinsic field region.

11. A method according to claim 10, wherein providing a nanopillar comprises providing a nanopillar that forms part of an array of nanopillars.

12. The method of claim 11, wherein the array is fabricated by etching a substrate using a self-masking etching process.

13. The method of claim 12, wherein the self-masking etching process is a deep reactive ion etching process.

14. The method of claim 12, wherein the nanopillar is further provided by depositing a metal onto the etched substrate.

15. The method of claim 14, wherein the metal is deposited using a sputtering process.

16. The method of claim 10, wherein the method further comprises providing first and second electrical contacts such that the graphene film is in physical contact with the first electrical contact.

* * * * *